(12) United States Patent
Sebastiani et al.

(10) Patent No.: US 11,735,276 B2
(45) Date of Patent: Aug. 22, 2023

(54) PROGRAMMING TECHNIQUES FOR POLARITY-BASED MEMORY CELLS

(71) Applicant: Micron Technology, Inc., Boise, ID (US)

(72) Inventors: Alessandro Sebastiani, Piacenza (IT); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 140 days.

(21) Appl. No.: 17/361,194

(22) Filed: Jun. 28, 2021

(65) Prior Publication Data
US 2022/0415409 A1 Dec. 29, 2022

(51) Int. Cl.
| | | |
|---|---|---|
| G11C 11/34 | (2006.01) | |
| G11C 16/30 | (2006.01) | |
| G11C 16/34 | (2006.01) | |
| G11C 16/32 | (2006.01) | |
| G11C 16/26 | (2006.01) | |
| G11C 16/08 | (2006.01) | |

(52) U.S. Cl.
CPC .............. *G11C 16/30* (2013.01); *G11C 16/08* (2013.01); *G11C 16/26* (2013.01); *G11C 16/32* (2013.01); *G11C 16/3404* (2013.01)

(58) Field of Classification Search
CPC ..... G11C 16/10; G11C 16/12; G11C 16/0483; G11C 16/3454; G11C 11/5678
USPC ........................................ 365/185.18, 185.19
See application file for complete search history.

(56) References Cited

U.S. PATENT DOCUMENTS

| | | |
|---|---|---|
| 2012/0236624 A1 | 9/2012 | Costa et al. |
| 2014/0098594 A1 | 4/2014 | Azuma et al. |
| 2019/0043923 A1* | 2/2019 | Ahmed ................. H10B 63/84 |
| 2019/0295636 A1 | 9/2019 | Tortorelli et al. |
| 2019/0348114 A1 | 11/2019 | Banerjee et al. |
| 2020/0111528 A1 | 4/2020 | Fantini et al. |
| 2021/0020243 A1 | 1/2021 | Robustelli |

FOREIGN PATENT DOCUMENTS

KR  10-2019-0025039 A  3/2019

OTHER PUBLICATIONS

"International Search Report and Written Opinion of the International Searching Authority," issued in connection with Int'l Appl. No. PCT/US2022/073032, dated Sep. 29, 2022 (9 pages).

Taiwan Patent Office, "Office Action," issued in connection with Taiwan Patent Application No. 111121772 dated Mar. 6, 2023 (20 pages) (7 pages of English Translation and 13 pages of Original Document).

* cited by examiner

*Primary Examiner* — Son T Dinh
(74) *Attorney, Agent, or Firm* — Holland & Hart LLP

(57) ABSTRACT

Methods, systems, and devices for programming techniques for polarity-based memory cells are described. A method may include writing memory cells to an intermediate state based on receiving a write command. Writing the intermediate state may include applying a first pulse having a first polarity to the memory cell. The method may include isolating a first access line coupled with the memory cell from a voltage source based on applying the first pulse. The method may also include applying a second pulse to a second access line coupled with the memory cell based on isolating the first access line.

25 Claims, 9 Drawing Sheets

▓ First Access Line Voltage

▨ Second Access Line Voltage

PROGRAMMING TECHNIQUES FOR POLARITY-BASED MEMORY CELLS

FIELD OF TECHNOLOGY

The following relates generally to one or more systems for memory and more specifically to programming techniques for polarity-based memory cells.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
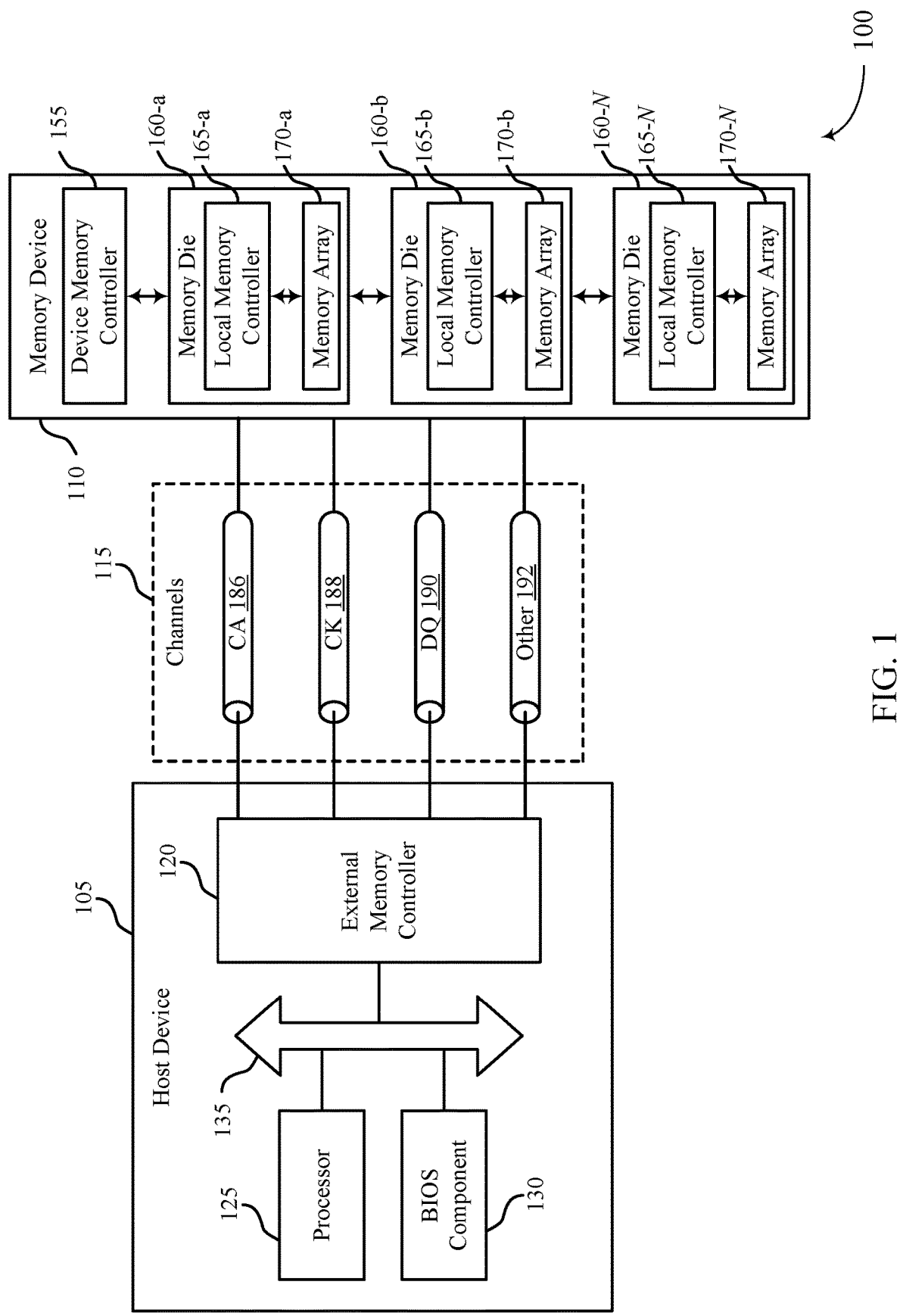
FIG. 1 illustrates an example of a system that supports programming techniques for polarity-based memory cells in accordance with examples as disclosed herein.

Some types of memory cells (e.g., memory cells comprising chalcogenide material), which may be referred to as polarity-based memory cells, may be written to different logic states using voltage pulses or current pulses with different polarities. For example, a memory cell may be written to a first logic state using a pulse of a first polarity or a second logic state using a pulse of a second polarity. In some cases, the logic state detected as stored in the memory cell may also be based on a polarity of the read pulse used to read the memory cell. For example, if a read pulse having a first polarity is used to read the memory cell, applying a write pulse having the first polarity may store the first logic state in the memory cell and applying a write pulse having the second polarity may store the second logic state in the memory cell. In other examples, if a read pulse having the second polarity is used to read the memory cell, applying a write pulse having the first polarity may store the second logic state in the memory cell and applying a write pulse having the second polarity may store the first logic state in the memory cell. In writing the first logic state or second logic state, a current across the memory cell may be managed by a current mirror to reduce impacts of current spikes. In some examples, the memory cells may be multiple-level cells that are configured to store three or more logic states. In such examples, programming techniques used to program the first logic state or second logic state may not be effective programing a third logic state (e.g., an intermediate state).

Systems, techniques, and devices are described herein to program a memory cell one of three states that includes an intermediate state between a first state and a second state. In some cases, the memory cell may use a current spike generated by a capacitive discharge of an access line coupled with the memory cell to write the memory cell to the intermediate state. For example, to program the memory cell to the intermediate state, a memory device may apply a first pulse to a first access line coupled to an unselected memory cell—e.g., precharge the first access line to a negative voltage. The memory device may then isolate the first access line from the memory cell—e.g., float the first access line. To write the intermediate state, the memory device may apply a second pulse to a second access line coupled with the memory cell—e.g., a positive voltage pulse to the second access line. In such examples, a current across the memory cell may spike and program the memory cell to the intermediate state. The memory cell may be deselected (e.g., turned off) based on the first access line and second access line being equalized—e.g., the current may flow from the second access line to charge the first access line through the memory cell until both sides of the memory cell are equalized. In some examples, by programming the memory cell with a current spike, the second pulse to the second access line may be shorter in duration than a programming pulse applied to program the memory cell to store the first state or second state. Having a shorter duration for the pulse may conserve power at the memory device. Additionally, the programming technique described herein may decrease disturbances that may occur on memory cells after read operations and enable the memory cell storing the intermediate state to be read when using a read pulse with either the first polarity or the second polarity—e.g., the memory cell storing the intermediate may have a voltage threshold that is distinguishable from the first state and the second state whether a read pulse with a positive polarity is used or a read pulse with a negative polarity is used.

Features of the disclosure are initially described in the context of memory systems, dies, and arrays as described with reference to FIGS. 1-3. Features of the disclosure are described in the context of plots and a process flow as described with reference to FIGS. 4-6. These and other features of the disclosure are further illustrated by and described with reference to an apparatus diagram and flowcharts that relate to programming techniques for polarity-based memory cells as described with references to FIGS. 7-9.

FIG. 1 illustrates an example of a system 100 that supports programming techniques for polarity-based memory cells in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 a, memory die 160 b, memory die 160 N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device. In some examples, the memory device 110 may receive a write command to write information to memory cells configured to store a set state, a reset state, and an intermediate state. In such examples, to write some memory cells to the intermediate state, the memory device 110 may generate a current spike across the memory cell. For example, the memory device 110 may apply a first pulse to condition the memory cell, apply a second pulse to a first access line coupled with the memory cell, and isolate the first access line based on applying the second pulse. In such examples, the memory device 110 may then apply a third pulse to a second access line coupled with the memory cell (while the memory cell is isolated from the first access line) to generate the current spike via the second access line capacitively discharging though the memory cell. The memory cell may be deselected based on the first access line and second access line equalizing. In some examples, the memory device 110 may apply an additional conditioning pulse before applying the second pulse to the first access line.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
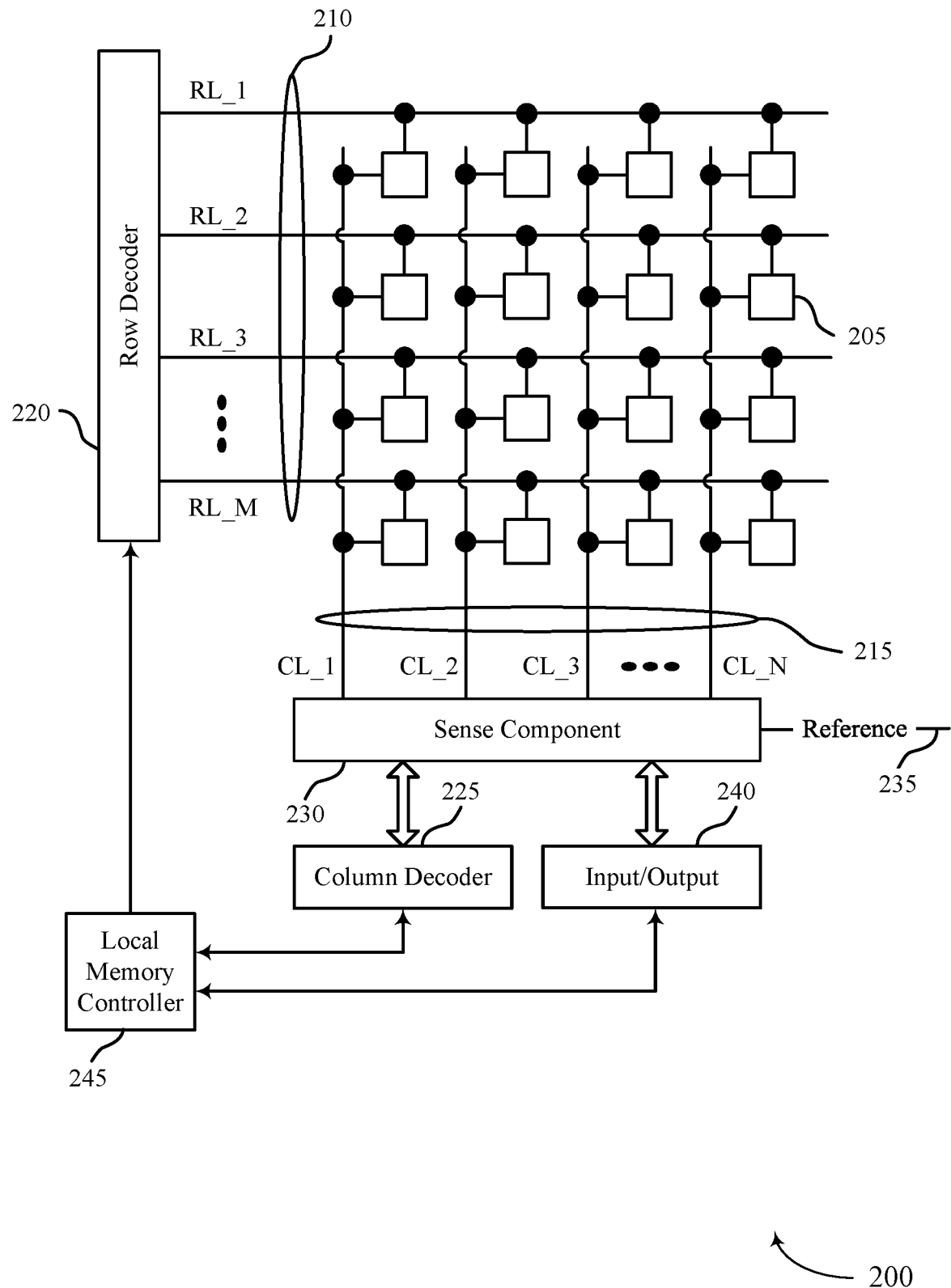
FIG. 2 illustrates an example of a memory die that supports programming techniques for polarity-based memory cells in accordance with examples as disclosed herein.

FIG. 2 illustrates an example of a memory die 200 that supports programming techniques for polarity-based memory cells in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cell 205 may be configured to store one and half (1.5) bits of information—e.g., using a set state, a reset state, and an intermediate state. In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a write operation (e.g., a programming operation) on one or more memory cells 205 of the memory die 200. During a write operation, a memory cell 205 of the memory die 200 may be programmed to store a desired logic state. The local memory controller 245 may identify a target memory cell 205 on which to perform the write operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The local memory controller 245 may apply a specific signal (e.g., write pulse) to the column line 215 during the write operation to store a specific state in the storage element of the memory cell 205. The pulse used as part of the write operation may include one or more voltage levels over a duration. In some examples, the local memory controller 245 may be configured to write the memory cell 205 to three or more states. For example, the local memory controller 245 may write a set state, a reset state, or an intermediate state to the memory cell 205. For example, the local controller 245 may select a memory cell 205 to write to an intermediate state. In such examples, the local controller 245 may apply a first pulse to condition the memory cell 205. In some examples, the local controller 245 may also apply an additional pulse to condition the memory cell 205, the additional pulse having a polarity opposite that of the first pulse. The local controller 245 may then apply a second pulse to a first access line (e.g., a negative voltage to word line 210 or digit line 215). When the first access line is precharged, the local memory controller 245 may isolate the first access line from a voltage source and apply a third pulse to the second access line (e.g., to the word line 210 or the digit line 215 which was not charged by the first pulse). In such examples, a current may spike across the memory cell 205 and write the memory cell 205 to the intermediate state.

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 245 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration. In some examples, the local memory controller 245 may perform a read operation by applying two read pulses—e.g., a pulse with a first polarity and a pulse with a second polarity, the first polarity the opposite of the second polarity. In such examples, the sense component 230 may determine the logic state of the memory cell 205 based on whether a threshold voltage of the memory cell 205 is high at the first read pulse, the second read pulse, or both as described with reference to FIG. 4.

Figure 3:
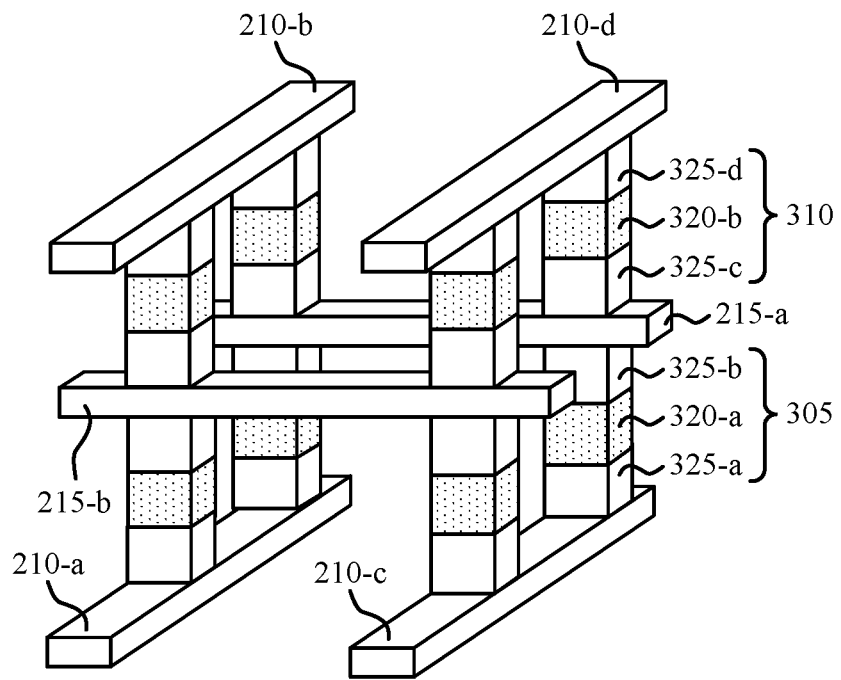
FIG. 3 illustrates an example of memory cells that support programming techniques for polarity-based memory cells in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be based on an alloy (such as the alloys listed above) and may be operated so as to undergo a change to different physical state during normal operation of the memory cell. For example, a self-selecting memory cell may have a high threshold voltage state and a low threshold voltage state. A high threshold voltage state may correspond to a first logic state (e.g., a RESET state) and a low threshold voltage state may correspond to a second logic state (e.g., a SET state). In some examples, the self-selecting memory cell may be configured to store three or more states. For example, the self-selecting memory cell may store a third logic state (e.g., an intermediate state) with a threshold voltage between the first logic state and the second logic state. In some examples, the self-selecting memory cell may be configured to store the first logic state or second logic state based on a polarity used to write the memory cell—e.g., a first polarity for the first logic state and a second polarity for the second logic state. In some examples, the self-selecting memory cell may be configured to store the third logic state based on a current spike during a write operation. That is, either the first polarity or second polarity may be used to program the third logic state. In such examples, the self-selecting memory cell may be applied with a first pulse configured to condition the memory cell. In some examples, the self-selecting memory cell may also be applied with an additional pulse to further condition the memory cell, the additional pulse having a polarity opposite that of the first pulse. A second pulse may then be applied to a first access line (e.g., a negative voltage to row line 210 or column line 215). When the first access line is precharged, the first access line may be isolated from a voltage source and a third pulse may be applied to the second access line (e.g., to the row line 210 or the column line 215 which was not charged by the first pulse). In such examples, a current may spike across the self-selecting memory cell and write the memory cell to the intermediate state During a programming (write) operation of a self-selecting memory cell (e.g., including electrode 325-a, storage element 320-a, and electrode 325-b), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320. In other examples, the threshold voltage of a memory cell storing a first logic state may be high at a first polarity and low at a second opposite polarity. The threshold voltage of a memory cell storing a second logic state may be low at the first polarity and high at the opposite polarity. The threshold voltage of a memory cell storing the third logic state may be high at both the first polarity and the second polarity. Accordingly, the logic state of the memory cell may be determined by applying two read pulses.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215).

Figure 4A:
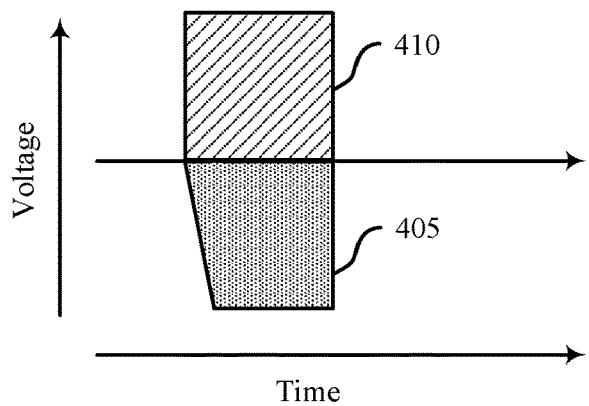
FIGS. 4A, 4B, and 4C illustrate examples of plots that support programming techniques for polarity-based memory cells in accordance with examples as disclosed herein.
Figure 4B:
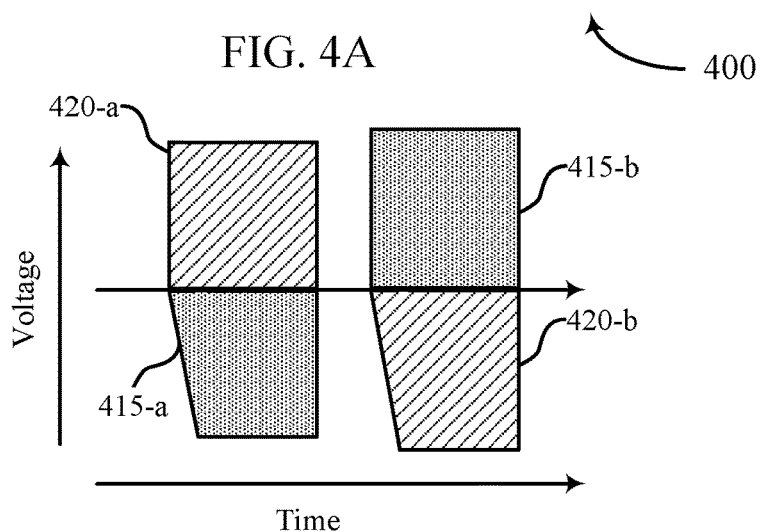
Figure 4C:
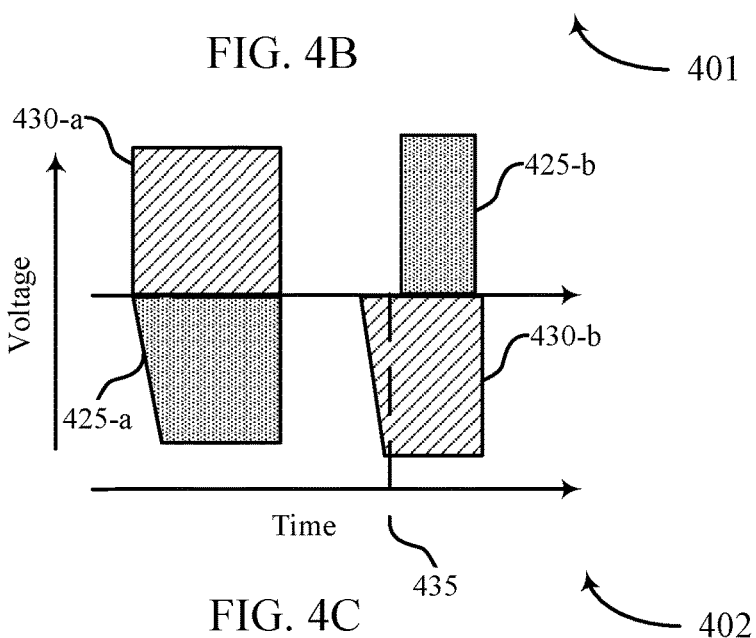

FIGS. 4A, 4B, and 4C illustrate an examples of plots 400, 401, and 402 of write operations that support programming techniques for polarity-based memory cells in accordance with examples as disclosed herein. For example, FIG. 4A may illustrate a plot 400 of a write operation to write a memory cell (e.g., memory cell 205 as described with reference to FIG. 2) to a set state, FIG. 4B may illustrate a plot 401 of a write operation to write a memory cell to a reset state, and FIG. 4C may illustrate a plot 402 of a write operation to write a memory cell to an intermediate state. The write operations depicted in FIGS. 4A, 4B, and 4C may be performed by a system (e.g., system 100 as described with reference to FIG. 1). For example, a memory device (e.g., memory device 110 as described with reference to FIG. 1) may perform the write operations on memory cells in a memory array (e.g., memory array 170 as described with reference to FIG. 1). The memory cells may be configured to store three or more logic states as described with reference to FIGS. 2 and 3.

The X-axis of the plots 400, 401, and 402 may represent time and the Y-axis of plots 400, 401, and 402 may represent a voltage of an applied pulse to a given memory cell or given access line (e.g., word line 210 or digit line 215 as described with reference to FIG. 2). In some examples, applying a pulse to a memory cell may refer to applying a pulse to both the first access line and the second access line. In other examples, applying a pulse to an access line may refer to a voltage applied to bias either a first access line or a second access line.

Referring to FIG. 4A, in some examples a memory device may receive a write command from a host device (e.g., host device 105 as described with reference to FIG. 1) to write information or data to one or more memory cell. In some examples, the write command may include data or information associated with a first logic state to be stored at the memory cells—e.g., a set state. In such examples, the memory device may perform a write operation as illustrated in plot 400. For example, the memory device (e.g., or a local memory controller 245 as described with reference to FIG. 2) may apply a first pulse to the memory cell. That is, the memory device may apply a pulse 405 to a bias a first access line to a first voltage and a pulse 410 to bias a second access line to a second voltage.

In some examples, the pulse 405 may be a negative voltage and the pulse 410 may be a positive voltage. In such examples, a polarity of a voltage across the memory cell may be based on whether the first access line is a word line or digit line—e.g., a voltage across a memory cell may be difference between a voltage of the digit line and word line. For example, the memory cell may be programmed to a positive polarity when the first access line is a word line and the second access line is a digit line and a negative polarity when the first access line is a digit line and the second access line is a word line. In some examples, the first pulse to the memory cell may also be associated with conditioning the memory cell to prevent drift. That is, a voltage threshold of a memory cell may change due to time, temperature, or other factors and the first pulse illustrated in plot 400 may mitigate drift e.g., cause the threshold voltage of the memory cell to revert back to the original threshold voltage.

Additionally, the memory device may use a current mirror while applying the pulse 405 and pulse 410. That is, applying either the pulse 405 or pulse 410 may cause a current to increase rapidly across the memory cell. The current mirror may be utilized to stabilize the current and prevent the current from dropping—e.g., the current mirror may maintain the current across the memory cell. Accordingly, the first pulse across the memory cell (e.g., pulse 405 to the first access line and pulse 410 to the second access line) may be applied for a first duration to program the memory cell to a set state.

Referring to FIG. 4B, in some examples the write command may include data or information associated with a second logic state to be stored at the memory cells—e.g., a reset state. In such examples, the memory device may perform a write operation as illustrated in plot 401. For example, the memory device may apply a first pulse to the memory cell—e.g., pulse 415-*a* to the first access line and pulse 420-*a* to the second access line. The first pulse may be the same as the first pulse illustrated in plot 400. That is, the memory device may apply the first pulse to some or all the memory cells in the memory array. In such examples, the memory cells may be written to the first logic state (e.g., set state) initially. The first pulse may also condition the memory cells—e.g., mitigate any drift in a given threshold voltage of a memory cell.

After applying the first pulse, the memory device may apply a second pulse having an opposite polarity to program a subset of memory cells that includes the memory cell to the second logic state (e.g., the reset state). That is, the first logic state and the second logic state may be associated with voltages of opposite polarities. In some examples, the first logic state may be associated with a positive polarity and the second logic state may be associated with a negative polarity or the first logic state may be associated with a negative polarity and the second logic state may be associated with the positive polarity. For example, the memory device may apply a pulse 415-b to bias a first access line to a third voltage and a pulse 420-b to bias a second access line to a fourth voltage. In some examples, the pulse 415-b may be a positive voltage and the pulse 420-b may be a negative voltage. In such examples, a polarity of a voltage across the memory cell may be based on whether the first access line is a word line or digit line—e.g., a voltage across a memory cell may be difference between a voltage of the digit line and word line. For example, the memory cell may be programmed to a negative polarity when the first access line is a word line and the second access line is a digit line and a positive polarity when the first access line is a digit line and the second access line is a word line. As described with reference to plot 400, the memory device may use a current mirror to limit a current spike across the memory cell while applying the first pulse (e.g., pulse 415-a and pulse 415-b) and the second pulse (e.g., pulse 415-b and pulse 420-b).

Referring to FIG. 4C, in some examples the write command may include data or information associated with a third logic state to be stored at the memory cells—e.g., an intermediate state. That is, a memory cell storing the set state may have a first threshold voltage and a memory cell storing the reset state may have a second threshold voltage different than the first threshold voltage. In such examples, a memory cell storing the intermediate state may have a third threshold voltage between the first threshold voltage and the second threshold voltage. The level of the threshold voltage detected in a memory cell may be different based on the polarity of the read pulse that is used. For example, if a read pulse having a first polarity is used to read the memory cell, the set state may exhibit a threshold voltage that is higher than the threshold voltage of the reset state. In some examples, if a read pulse having a second polarity is used to read the memory cell, the set state may exhibit a threshold voltage that is lower than the threshold voltage of the reset state. The intermediate state may be configured such that it is distinguishable from the set state and the reset state in response to a read voltage having the first polarity being used and in response to a read voltage having the second polarity being used. In some examples, the third threshold voltage may be the same as the second threshold voltage.

To program a memory cell to the intermediate state, the memory device may perform a write operation as illustrated in plot 402. For example, the memory device may apply a first pulse to the memory cell—e.g., pulse 425-a to the first access line and pulse 430-a to the second access line. The first pulse may be the same as the first pulse illustrated in plot 400. That is, the memory device may apply the first pulse to some or all the memory cells in the memory array. In such examples, the memory cells may be written to the first logic state (e.g., set state) initially. The first pulse may also condition the memory cells—e.g., mitigate any drift in a given threshold voltage of a memory cell.

After applying the first pulse, the memory device may apply a second pulse 430-b to bias the second access line. For example, the second pulse 430-b may be a negative pulse. In such examples, the memory device may bias (e.g., precharge) the second access line to a fifth voltage—e.g., a negative voltage. In some cases, at a time 435, a voltage of the second access line may be at the fifth voltage. In such examples, the memory device may isolate the second access line from a voltage source—e.g., a negative voltage source or a negative decoder. For example, the memory device may deactivate the voltage source such that the second access line is not coupled to any voltages and a node coupled to the memory cell and second access line is floating. In other examples, the memory device may deactivate a switch coupling the voltage source to the second access line. For example, the memory array may include a transistor (e.g., an N-type metal-oxide-semiconductor (nMOS) transistor) coupled with a voltage (e.g., a signal or mitigation signal). In some examples, the voltage (e.g., signal) may be applied at a gate of the transistor. Based on a timing of the write operation (e.g., a predetermined timing), the voltage at the gate may be deactivated or go low at the time 435. Accordingly, the transistor may be deactivated and isolate the second access line from the voltage source. Isolating the transistor may also isolate the current mirror from the second access line and memory cell as described with reference to plots 400 and 401—e.g., the current mirror may not have an effect on the memory cell during the write operation illustrated in plot 402.

After isolating the second access line from the memory cell at 435, the memory device may apply a third pulse 425-b to bias the first access line to a sixth voltage. The third pulse 425-b may be applied to the first access line while the second access line is floating (e.g., isolated from a voltage source). Although shown at a time after 435, in some examples, the memory device may apply the pulse 425-b immediately after the isolation or concurrent with the isolation—e.g., less current may leak based on a smaller duration between isolating the second access line and applying the third pulse 425-b to the first access line. In some examples, applying the third pulse 425-b may cause a current across the memory cell to spike rapidly. Additionally, the current spike may also bias the second access line—e.g., the node coupled with the second access line and the memory cell may be charged until equalized with a second node coupled with the first access line and the memory cell. Accordingly, when the third pulse 425-b is finished being applied, the current across the memory cell may drop quickly to 0 (e.g., approximately 0). That is, a positive voltage of the third pulse 425-b and a negative voltage of the second pulse 430-b may equalize at 0. In such examples, the rapid drop in the current may deselect (e.g., turn off) the memory cell.

In some examples, the rapid current spike and current drop across the memory cell may program the memory cell to the intermediate state. Because the memory cell is programmed to the intermediate state based on a rapid current spike and current drop, the third pulse 425-b may be applied for a second duration shorter than the first duration—e.g., shorter than the duration of the first pulse or the second pulse to program the memory cell to the first logic state or the second logic state. Accordingly, the memory device may conserve power when programming the intermediate state. Utilizing the write operation illustrated in plot 402 may also cause better read disturbance immunity on high voltage threshold states e.g., voltage threshold or logic state changes based on a high quantity of read operations may be reduced or mitigated. Additionally, the memory cell storing the intermediate state may be programmed with either the first polarity or the second polarity. That is, a polarity of a voltage across the memory cell may be based on whether the first access line is a word line or digit line. For example, the memory cell may be programmed to a negative polarity when the first access line is a word line and the second access line is a digit line and a positive polarity when the first access line is a digit line and the second access line is a word line.

In some examples, after programming the memory cells to the first logic state, the second logic state, or the third logic state, the memory device may perform a read operation to determine a logic state of a given memory cell. In some examples, when the memory cells are configured to store the set state, the reset state, or the intermediate state, the memory device may use two read pulses. For example, the memory device may use a first read pulse with the first polarity and a second read pulse with the second polarity—e.g., opposite polarities. When the memory device applies the first read pulse, memory cells storing the first logic state or third logic state may exhibit a high threshold voltage and memory cells storing the second logic state may exhibit a low threshold voltage. When the memory device applies the second read pulse, memory cells storing the second logic state or the third logic state may exhibit a high threshold voltage and memory cells storing the first logic state may exhibit a low threshold voltage. That is, memory cells storing the first logic state and the second logic state may be at a high threshold voltage or a low threshold voltage based on the respective polarity applied. Memory cells storing the third logic state may be at a high threshold voltage irrespective of the polarity applied. Accordingly, the memory device may determine if memory cells store the first logic state, second logic state, or third logic state by applying the first and second read pulses with opposite polarities.

Figure 5:
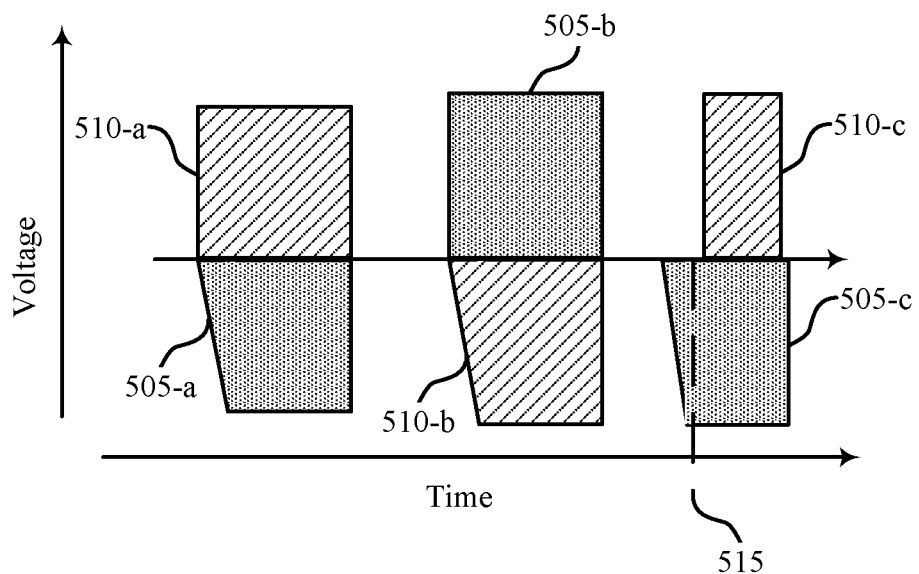
FIG. 5 illustrates an example of a plot that supports programming techniques for polarity-based memory cells in accordance with examples as disclosed herein.

FIG. 5 illustrates an example of a plot 500 of a write operation that supports programming techniques for polarity-based memory cells in accordance with examples as disclosed herein. For example, FIG. 5 illustrates a plot 500 of a write operation to write a memory cell (e.g., memory cell 205 as described with reference to FIG. 2) to an intermediate state. In some examples, the write operation illustrated in FIG. 5 may be an alternative to the write operation illustrated in plot 402 to write a memory cell to the intermediate state. The write operations depicted in FIG. 5 may be performed by a system (e.g., system 100 as described with reference to FIG. 1). For example, a memory device (e.g., memory device 110 as described with reference to FIG. 1) may perform the write operations on memory cells in a memory array (e.g., memory array 170 as described with reference to FIG. 1).

The X-axis of the plot 500 may represent time and the Y-axis of plot 500 may represent a voltage of an applied pulse to a given memory cell or given access line (e.g., word line 210 or digit line 215 as described with reference to FIG. 2). In some examples, a pulse to a memory cell may refer to applying a pulse to both the first and second access line. In other examples, a pulse to an access line may refer to a voltage applied to bias either a first access line or a second access line coupled to the memory cell.

In some examples, a memory device may receive a write command from a host device (e.g., host device 105 as described with reference to FIG. 1) to write information or data to one or more memory cell—e.g., to a first logic state, a second logic state, or a third logic state. To write the memory cell to the third logic state, the memory device may utilize the write operation illustrated in plot 500.

For example, the memory device may apply a first pulse (e.g., pulse 510-a and pulse 505-a) to a given memory cell. In some examples, the first pulse may be the same as the first pulse illustrated in plots 400, 401, and 402 as described with reference to FIG. 4. That is, the first pulse may condition the memory cell and mitigate drift. After applying the first pulse, the memory device may apply a second pulse (e.g., pulse 505-b and pulse 510-b) to the memory cell. In some examples, the second pulse may have a polarity opposite the first pulse. In some cases, the polarity of the first pulse and second pulse may depend on whether the first access line is a digit line or a word line. For example, the memory device may apply a first pulse with a positive polarity when the first access line is a word line and the second access line is a digit line and a negative polarity when the first access line is a digit line and the second access line is a word line. The second pulse may have a polarity opposite of a polarity of the first pulse—e.g., negative if the first polarity is positive and positive if the first polarity is negative. In some examples, the second pulse may be the same as the second pulse as illustrated in plot 401—e.g., the memory cell may be in a reset state after the first pulse and the second pulse. In some examples, the additional pulse—e.g., compared with plot 402, may further condition the memory cell. The write operation illustrated in plot 500 may consume additional power compared with the write operation illustrated in plot 402 but also cause a current spike that is greater than a current spike generated by the write operation illustrated in plot 402. This may result in additional read disturb prevention.

Figure 6:
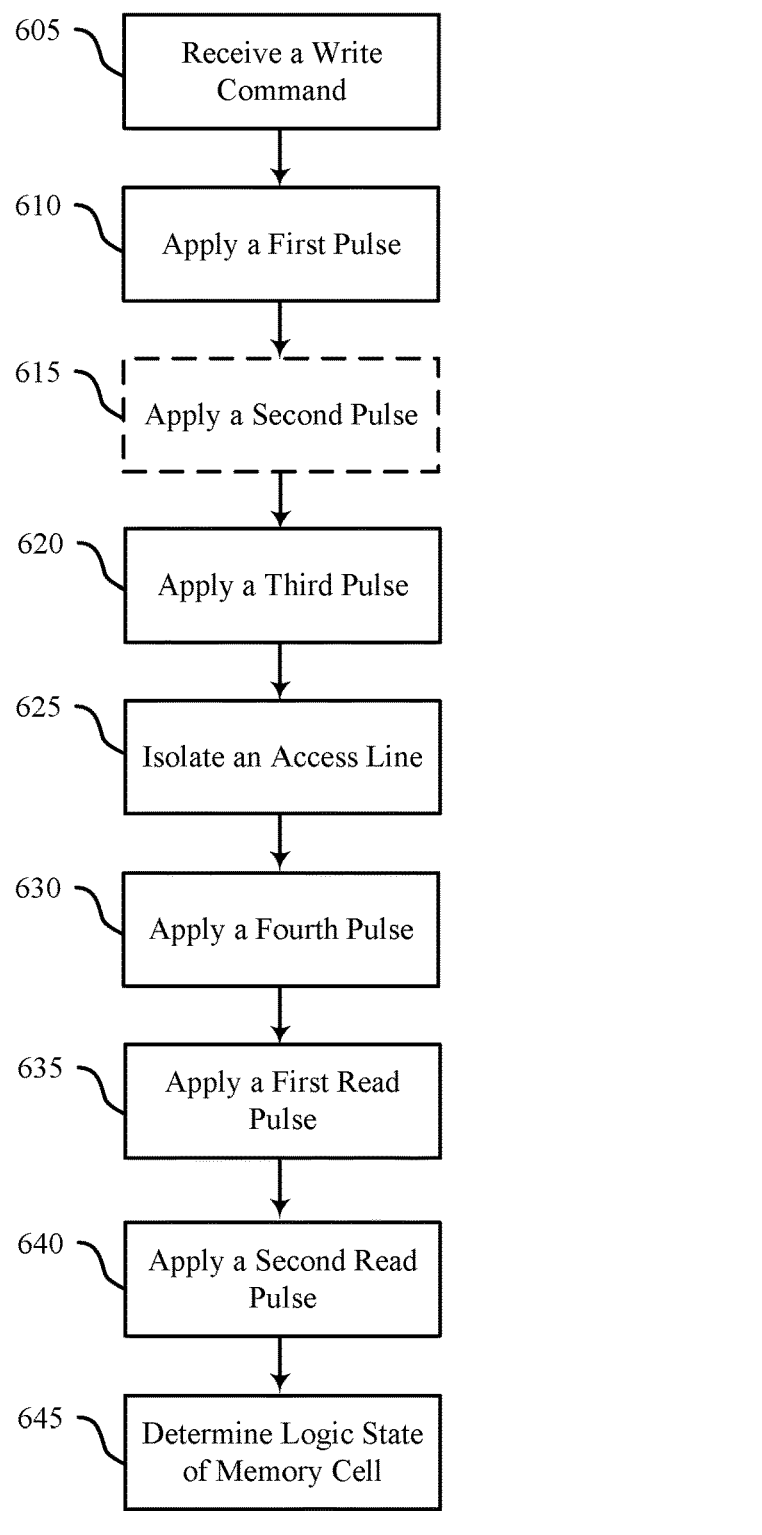
FIG. 6 illustrates an example of a process diagram that supports programming techniques for polarity-based memory cells in accordance with examples as disclosed herein.

After applying the second pulse, the memory device may apply a third pulse 505-c to the bias the first access line to a first voltage—e.g., a negative voltage. In some examples, at a time 515, the first access line may be at the first voltage. In such examples, the memory device may isolate the first access line from a voltage source as described with reference to FIG. 4C and plot 402—e.g., by deactivating a transistor or a voltage supply. After isolating the first access line, the memory device may apply a fourth pulse 510-c to bias the second access line to a second voltage—e.g., a positive voltage. As described with reference to FIG. 4C, to reduce the current leakage, the fourth pulse 510-c may be applied concurrently with or immediately after isolating the first access line. In some examples, applying the fourth pulse 510-c may cause a current across the memory cell to spike rapidly. Additionally, the current spike may also bias the first access line—e.g., a node coupled with a first access line and the memory cell may be charged until equalized with a second node coupled with the second access line and the memory cell. Accordingly, when the fourth pulse 510-c is finished being applied, the current across the memory cell may drop quickly to 0 (e.g., approximately 0). That is, a positive voltage of the fourth pulse 510-c and a negative voltage of the third pulse 505-c may equalize at 0. In such examples, the rapid drop in the current may deselect (e.g., turn off) the memory cell and program the memory cell to the intermediate state. Because the memory cell is programmed to the intermediate state based on a rapid current spike and current drop, the fourth pulse 510-c may be applied for a duration shorter than a duration of the first pulse or the second pulse. The memory cell storing the intermediate state may be programmed using either a first polarity or a second polarity. That is, a polarity of a voltage across the memory cell may be based on whether the first access line is a word line or digit line. For example, the memory cell may be programmed to a positive polarity when the first access line is a word line and the second access line is a digit line and a negative polarity when the first access line is a digit line and the second access line is a word line FIG. 6 illustrates an example of process diagram 600 that supports programming techniques for polarity-based memory cells in accordance with examples as disclosed herein. The operations of the process diagram may be implemented by a system or its components as described herein. For example, process diagram 600 may be performed by a system or device as described with reference to FIGS. 1-3 (e.g., system 100, memory die 200, or memory array 300). Process diagram 600 may illustrate a write operation to program a memory cell to an intermediate state as described with reference to FIGS. 4 and 5.

At 605, a memory device (e.g., memory device 110 as described with reference to FIG. 1) or a controller (e.g., local memory controller 245 as described with reference to FIG. 2) may receive a write command from a host system (e.g., host device 105 as described with reference to FIG. 1). In some examples, the write command may indicate to write information to memory cells comprising chalcogenide material. For example, the write command may indicate to write a set state, a reset state, or an intermediate state to the memory cells. The memory device may select a subset of memory cells in the memory array to program to the intermediate state based on receiving the write command.

At 610, the memory device may apply a first pulse to the memory cell to condition the memory cell. For example, the memory device may apply a pulse to bias a first access line and a pulse to bias a second access line as illustrated in plot 402 and 500. In some examples, the first pulse may mitigate drift at the memory cell. In some examples, the pulse to the first access line may be a negative voltage and the pulse to the second access line may be a positive voltage. In such examples, a polarity of a voltage across the memory cell may depend on whether the first access line is a word line or digit line—e.g., a negative polarity when the first access line is a digit line (e.g., digit line 215 as described with reference to FIG. 2) and a positive polarity when the first access line is a word line (e.g., word line 210 as described with reference to FIG. 2).

At 615, the memory device may apply an optional second pulse to the memory cell to further condition the memory cell—e.g., as illustrated in plot 500. For example, the memory device may apply a pulse to bias the first access line and apply a pulse to bias the second access line as illustrated in plot 500. In some examples, the second pulse may have a polarity opposite of the first pulse—e.g., a negative polarity if the first pulse has a positive polarity and a positive polarity if the first pulse has a negative polarity. The optional second pulse may improve read disturb immunity and cause a greater current spike at 630.

At 620, the memory device may apply a third pulse to either the first access line or the second access line based on whether the optional second pulse is applied. For example, if the second pulse is not applied, the memory device may apply a third pulse to the second access line—e.g., as illustrated in plot 402. In other examples, if the second pulse is applied, the memory device may apply a third pulse to the first access line as illustrated in plot 500. In some examples, the third pulse may bias the respective access line to a negative voltage.

At 625, the memory device may isolate the respective access line (e.g., the access line) the third pulse is applied to. In some examples, the memory device may isolate the access line by decoupling the access line from a voltage source when the access line is biased to the negative voltage. For example, the memory device may deactivate a switch, a transistor coupled with the voltage source and the access line, or the voltage source as described with reference to FIG. 4. For example, the memory device may deactivate the transistor by deactivating a mitigation signal applied to a gate of the transistor. Isolating the access line may cause a node coupled with the access line and memory cell to be floating—e.g., not coupled to any voltage sources.

At 630, the memory device may apply a fourth pulse to an access line the third pulse is not applied to (e.g., the other access line). In some examples, the memory device may apply the fourth pulse concurrently with or immediately after isolating the access line. In some examples, the memory device may apply the fourth pulse to bias the other access line to a positive voltage. Applying the fourth pulse may also generate a current spike across the memory cell. Because the access line may be isolated from the voltage source, the memory cell may be isolated from a current mirror and the current may drop rapidly across the memory cell after the fourth pulse is finished being applied—e.g., until both sides of the memory cell are equalized as described with reference to FIG. 4. Accordingly, the memory cell may be programmed to the intermediate state. In some examples, the fourth pulse may be applied for a duration less than the first pulse, second pulse, and third pulse. This may reduce power consumption. Additionally, the memory device may program the memory cell to the intermediate state using either a positive or negative polarity. Utilizing the current spike to program the memory cell may also reduce read disturbances.

At 635, the memory device may apply a first read pulse to the memory cells. In some examples, after programming the memory cell to the intermediate state, the memory device may receive a read command from the host device. In such examples, the memory device may perform a read operation to determine a logic state of the memory cell based on receiving the read command. In some cases, the memory device may perform a read operation with a first read pulse and a second read pulse to determine the logic state of the memory cell. For example, the memory device may apply a first read pulse to given memory cells. The first read pulse may be a pulse with a first polarity (e.g., a positive polarity). The first read pulse may cause a first set of memory cells to exhibit a high voltage threshold and a second set of memory cells to exhibit a low threshold voltage.

At 640, the memory device may apply a second read pulse to the memory cell. In some examples, the second read pulse may have a second polarity opposite of the first polarity (e.g., a negative polarity). The second read pulse may cause a third set of memory cells to exhibit a high threshold voltage and a fourth set of cells to exhibit a low threshold voltage.

At 645, the memory device may determine a logic state of memory cells in the memory array based at least in part on applying the first pulse and the second pulse. For example, a memory cell having a first logic state (e.g., set state) may exhibit a high voltage threshold based on the first read pulse being applied and a low threshold voltage based on the second read pulse being applied—e.g., the memory cell having the first logic state may be in the first set of memory cells. A memory cell having a second logic state may exhibit a high voltage threshold based on the second read pulse being applied and a low threshold voltage based on the first read pulse being applied—e.g., the memory cell having the second logic state (e.g., reset state) may be in the second set and third set of memory cells. A memory cell having a third logic state (e.g., intermediate state) may exhibit a high threshold voltage based on the first pulse or the second pulse being applied—e.g., the memory cells having the third logic state may be in the first set of memory cells and the third set of memory cells. Accordingly, the memory device may determine the memory cells in the second set are associated with the second logic state, memory cells in the fourth set are associated with the first logic state, and the remaining memory cells in the first set and third set are associated with the third logic state—e.g., the memory cells that exhibit a high threshold voltage at both the first read pulse and second read pulse may store the third logic state. The memory cells storing the third logic state may exhibit high threshold voltages at both the first read pulse and second read pulse based on being programmable by either the first polarity or the second polarity.

Figure 7:
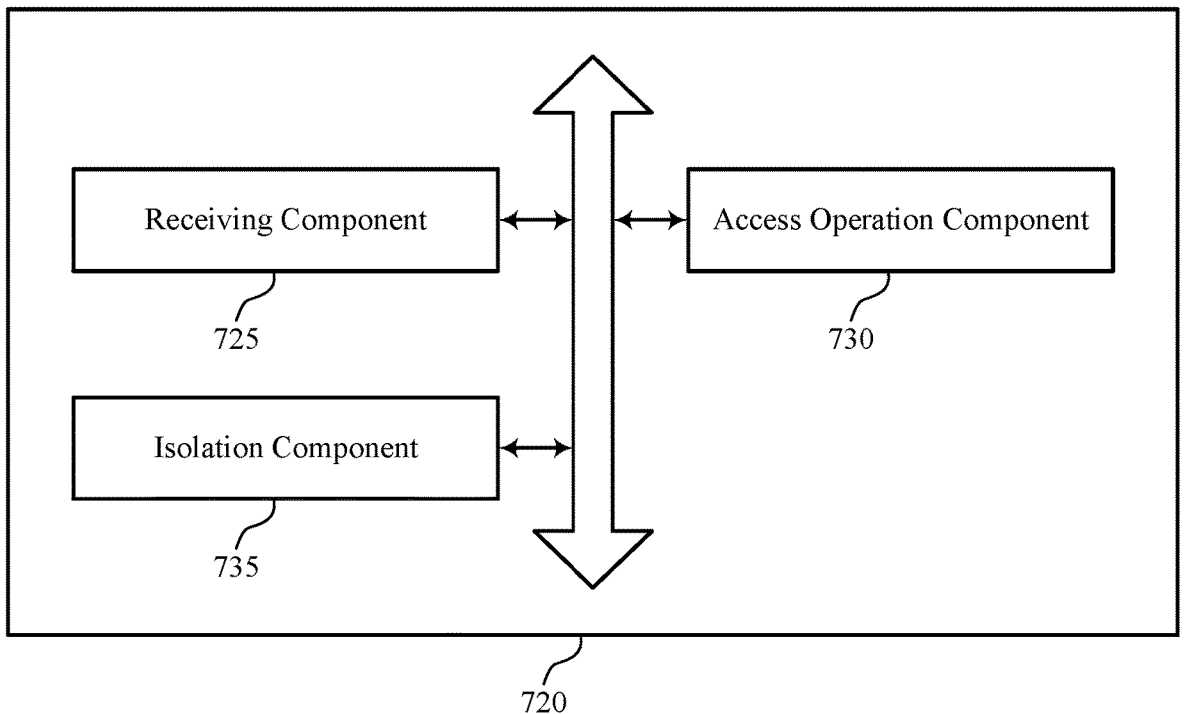
FIG. 7 shows a block diagram of a memory device that supports programming techniques for polarity-based memory cells in accordance with examples as disclosed herein.

FIG. 7 shows a block diagram 700 of a memory device 720 that supports programming techniques for polarity-based memory cells in accordance with examples as disclosed herein. The memory device 720 may be an example of aspects of a memory device as described with reference to FIGS. 1 through 6. The memory device 720, or various components thereof, may be an example of means for performing various aspects of programming techniques for polarity-based memory cells as described herein. For example, the memory device 720 may include a receiving component 725, an access operation component 730, an isolation component 735, or any combination thereof. Each of these components may communicate, directly or indirectly, with one another (e.g., via one or more buses).

The receiving component 725 may be configured as or otherwise support a means for receiving, at a memory device, a command to write information to memory cells including a chalcogenide material and configured to store a set state, a reset state, and an intermediate state.

The access operation component 730 may be configured as or otherwise support a means for writing a memory cell of the memory device to the intermediate state based at least in part on receiving the command, where writing the memory cell to the intermediate state includes applying a first pulse having a first polarity to the memory cell, the first pulse configured to condition the memory cell, isolating a first access line coupled with the memory cell from a voltage source based at least in part on applying the first pulse having the first polarity, and applying a second pulse to a second access line coupled with the memory cell based at least in part on isolating the first access line coupled with the memory cell. In some examples, the access operation component 730 may be configured as or otherwise support a means for applying a first pulse having a first polarity to the memory cell, the first pulse configured to condition the memory cell.

The isolation component 735 may be configured as or otherwise support a means for isolating a first access line coupled with the memory cell from a voltage source based at least in part on applying the first pulse having the first polarity. In some cases, the access operation component 730 may be configured as or otherwise support a means for applying a second pulse to a second access line coupled with the memory cell based at least in part on isolating the first access line coupled with the memory cell.

In some instances, to support writing the memory cell to the intermediate state, the access operation component 730 may be configured as or otherwise support a means for biasing the first access line to a first voltage, where isolating the first access line is based at least in part on biasing the first access line to the first voltage. In some examples, the access operation component 730 may be configured as or otherwise support a means for applying the first pulse to the memory cell for a first duration, and the second pulse for a second duration, the first duration greater than the second duration.

In some examples, to support writing the memory cell to the intermediate state, the access operation component 730 may be configured as or otherwise support a means for applying, before isolating the first access line, a third pulse having a second polarity to the memory cell, the third pulse configured to condition the memory cell.

In some cases, the access operation component 730 may be configured as or otherwise support a means for applying the first polarity, a positive polarity, and the second polarity, a negative polarity.

In some instances, the access operation component 730 may be configured as or otherwise support a means for applying the first pulse to mitigate drift of a threshold voltage associated with the memory cell.

In some examples, to support applying the second pulse to the second access line, the access operation component 730 may be configured as or otherwise support a means for biasing the second access line to a first voltage. In some examples, to support applying the first pulse to the memory cell that has the first polarity, the access operation component 730 may be configured as or otherwise support a means for biasing the first access line to a first voltage. In some cases, to support applying the first pulse to the memory cell that has the first polarity, the access operation component 730 may be configured as or otherwise support a means for biasing the second access line to a second voltage. In some instances, the first access line includes a word line and the second access line includes a digit line. In some examples, the first access line includes a digit line and the second access line includes a word line.

In some examples, to support isolating the first access line from the voltage source, the isolation component 735 may be configured as or otherwise support a means for biasing a gate of a transistor coupled with the voltage source and the first access line to a first voltage, where the transistor is deactivated based at least in part on biasing the gate of the transistor. In some cases, to support isolating the first access line from the voltage source, the isolation component 735 may be configured as or otherwise support a means for deactivating the voltage source based at least in part on an absence of receiving a signal.

In some instances, the receiving component 725 may be configured as or otherwise support a means for receiving, at a memory device, a command to write information to memory cells configured to store three or more states.

In some examples, the access operation component 730 may be configured as or otherwise support a means for writing a memory cell of the memory device to an intermediate state of the three or more states based at least in part on receiving the command, where writing the memory cell to the intermediate state includes applying a first pulse having a first polarity to the memory cell, applying a second pulse having a second polarity to the memory cell based at least in part on applying the first pulse, isolating a first access line coupled with the memory cell from a voltage source based at least in part on applying the second pulse having the second polarity, and applying a third pulse to a second access line coupled with the memory cell to write the memory cell to the intermediate state based at least in part on isolating the first access line coupled with the memory cell. In some instances, the access operation component 730 may be configured as or otherwise support a means for applying a first pulse having a first polarity to the memory cell.

In some cases, the access operation component 730 may be configured as or otherwise support a means for applying a second pulse having a second polarity to the memory cell based at least in part on applying the first pulse. In some examples, the access operation component 730 may be configured as or otherwise support a means for applying a third pulse to a second access line coupled with the memory cell to write the memory cell to the intermediate state based at least in part on isolating the first access line coupled with the memory cell.

In some examples, to support writing the memory cell to the intermediate state, the access operation component 730 may be configured as or otherwise support a means for biasing the first access line to a first voltage based at least in part on applying the second pulse, where isolating the first access line is based at least in part on biasing the first access line to the first voltage. In some cases, the access operation component 730 may be configured as or otherwise support a means for applying the first pulse for a first duration and the third pulse for a second duration, the first duration greater than the second duration. In some instances, to support applying the first pulse to the memory cell that has the first polarity, the access operation component 730 may be configured as or otherwise support a means for biasing the first access line to a first voltage. In some instances, to support applying the first pulse to the memory cell that has the first polarity, the access operation component 730 may be configured as or otherwise support a means for biasing the second access line to a second voltage.

In some cases, to support applying the second pulse to the memory cell that has the second polarity, the access operation component 730 may be configured as or otherwise support a means for biasing the first access line to the second voltage. In some examples, to support applying the second pulse to the memory cell that has the second polarity, the access operation component 730 may be configured as or otherwise support a means for biasing the second access line to the first voltage.

In some cases, the isolation component 735 may be configured as or otherwise support a means for isolating a first access line coupled with the memory cell from a voltage source based at least in part on applying the second pulse having the second polarity.

In some instances, to support isolating the first access line, the isolation component 735 may be configured as or otherwise support a means for biasing a gate of a transistor coupled with the voltage source and the first access line to a first voltage, where the transistor is deactivated based at least in part on biasing the gate of the transistor. In some cases, to support isolating the first access line, the isolation component 735 may be configured as or otherwise support a means for deactivating the voltage source based at least in part on an absence of receiving a signal.

Figure 8:
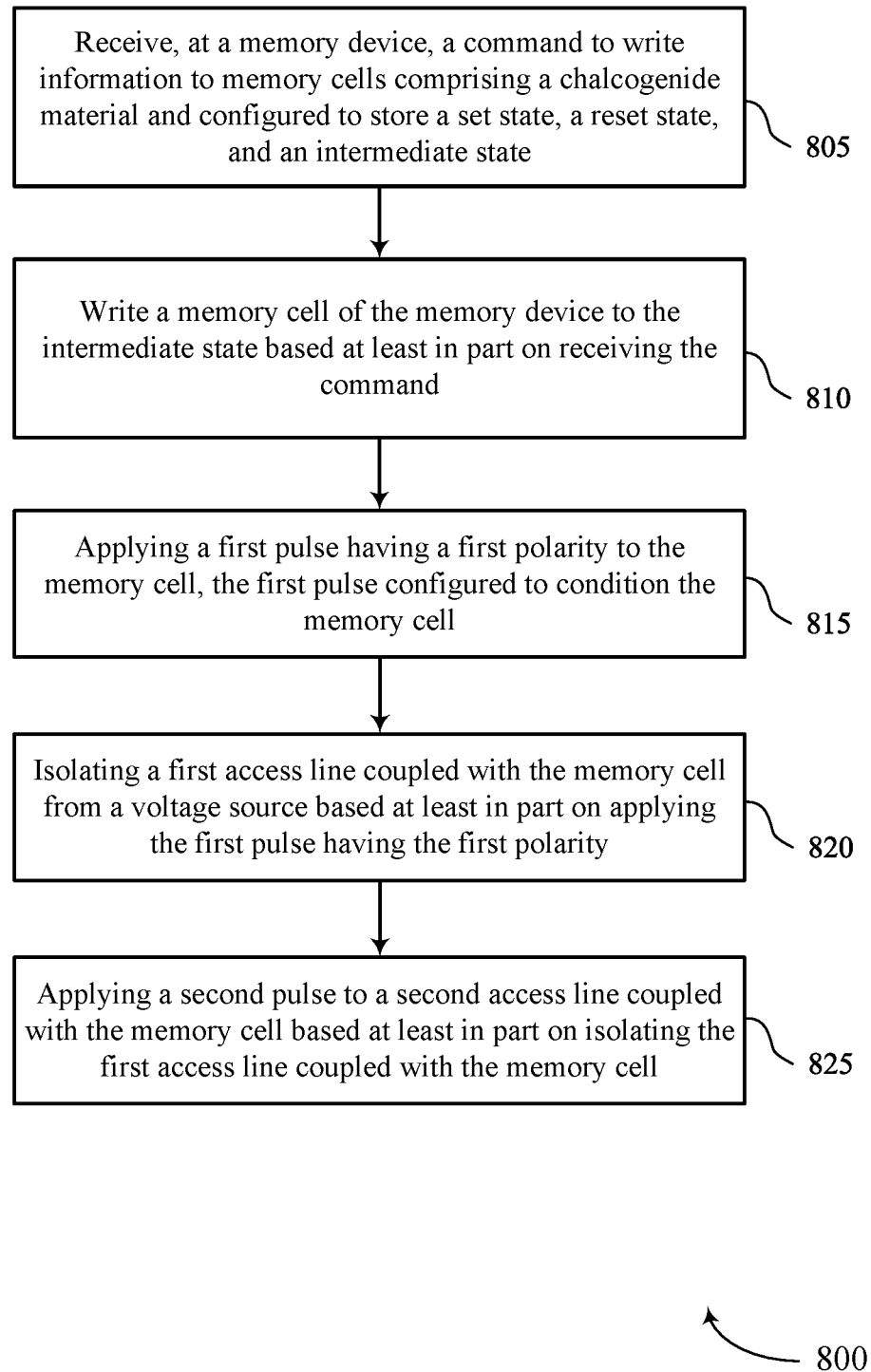
FIGS. 8 and 9 show flowcharts illustrating a method or methods that support programming techniques for polarity-based memory cells in accordance with examples as disclosed herein.

FIG. 8 shows a flowchart illustrating a method 800 that supports programming techniques for polarity-based memory cells in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 805, the method may include receiving, at a memory device, a command to write information to memory cells including a chalcogenide material and configured to store a set state, a reset state, and an intermediate state. The operations of 805 may be performed in accordance with examples as disclosed herein. In some examples, aspects of the operations of 805 may be performed by a receiving component 725 as described with reference to FIG. 7.

At 810, the method may include writing a memory cell of the memory device to the intermediate state based at least in part on receiving the command, where writing the memory cell to the intermediate state may include the features described with reference to 815 and 820. The operations of 810 may be performed in accordance with examples as disclosed herein. In some examples, aspects of the operations of 810 may be performed by an access operation component 730 as described with reference to FIG. 7.

At 815, the method may include applying a first pulse having a first polarity to the memory cell, the first pulse configured to condition the memory cell. The operations of 815 may be performed in accordance with examples as disclosed herein. In some examples, aspects of the operations of 815 may be performed by an access operation component 730 as described with reference to FIG. 7.

At 820, the method may include isolating a first access line coupled with the memory cell from a voltage source based at least in part on applying the first pulse having the first polarity. The operations of 820 may be performed in accordance with examples as disclosed herein. In some examples, aspects of the operations of 820 may be performed by an isolation component 735 as described with reference to FIG. 7.

At 825, the method may include applying a second pulse to a second access line coupled with the memory cell based at least in part on isolating the first access line coupled with the memory cell. The operations of 825 may be performed in accordance with examples as disclosed herein. In some examples, aspects of the operations of 825 may be performed by an access operation component 730 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving, at a memory device, a command to write information to memory cells including a chalcogenide material and configured to store a set state, a reset state, and an intermediate state, writing a memory cell of the memory device to the intermediate state based at least in part on receiving the command, where writing the memory cell to the intermediate state includes, applying a first pulse having a first polarity to the memory cell, the first pulse configured to condition the memory cell, isolating a first access line coupled with the memory cell from a voltage source based at least in part on applying the first pulse having the first polarity, and applying a second pulse to a second access line coupled with the memory cell based at least in part on isolating the first access line coupled with the memory cell.

In some examples of the method 800 and the apparatus described herein, writing the memory cell to the intermediate state may include operations, features, circuitry, logic, means, or instructions for biasing the first access line to a first voltage, where isolating the first access line may be based at least in part on biasing the first access line to the first voltage.

In some instances of the method 800 and the apparatus described herein, the first pulse may be applied to the memory cell for a first duration, the second pulse may be applied for a second duration, the first duration greater than the second duration.

In some cases of the method 800 and the apparatus described herein, writing the memory cell to the intermediate state may include operations, features, circuitry, logic, means, or instructions for applying, before isolating the first access line, a third pulse having a second polarity to the memory cell, the third pulse configured to condition the memory cell.

In some examples of the method 800 and the apparatus described herein, the first polarity may be a positive polarity and the second polarity may be a negative polarity.

In some instances of the method 800 and the apparatus described herein, the first pulse may be configured to mitigate drift of a threshold voltage associated with the memory cell.

In some cases of the method 800 and the apparatus described herein, isolating the first access line from the voltage source may include operations, features, circuitry, logic, means, or instructions for biasing a gate of a transistor coupled with the voltage source and the first access line to a first voltage, where the transistor may be deactivated based at least in part on biasing the gate of the transistor.

In some examples of the method 800 and the apparatus described herein, isolating the first access line from the voltage source may include operations, features, circuitry, logic, means, or instructions for deactivating the voltage source based at least in part on an absence of receiving a signal.

In some instances of the method 800 and the apparatus described herein, applying the second pulse to the second access line may include operations, features, circuitry, logic, means, or instructions for biasing the second access line to a first voltage.

In some cases of the method 800 and the apparatus described herein, applying the first pulse to the memory cell that may have the first polarity may include operations, features, circuitry, logic, means, or instructions for biasing the first access line to a first voltage and biasing the second access line to a second voltage.

In some examples of the method 800 and the apparatus described herein, the first access line includes a word line and the second access line includes a digit line.

In some instances of the method 800 and the apparatus described herein, the first access line includes a digit line and the second access line includes a word line.

Figure 9:
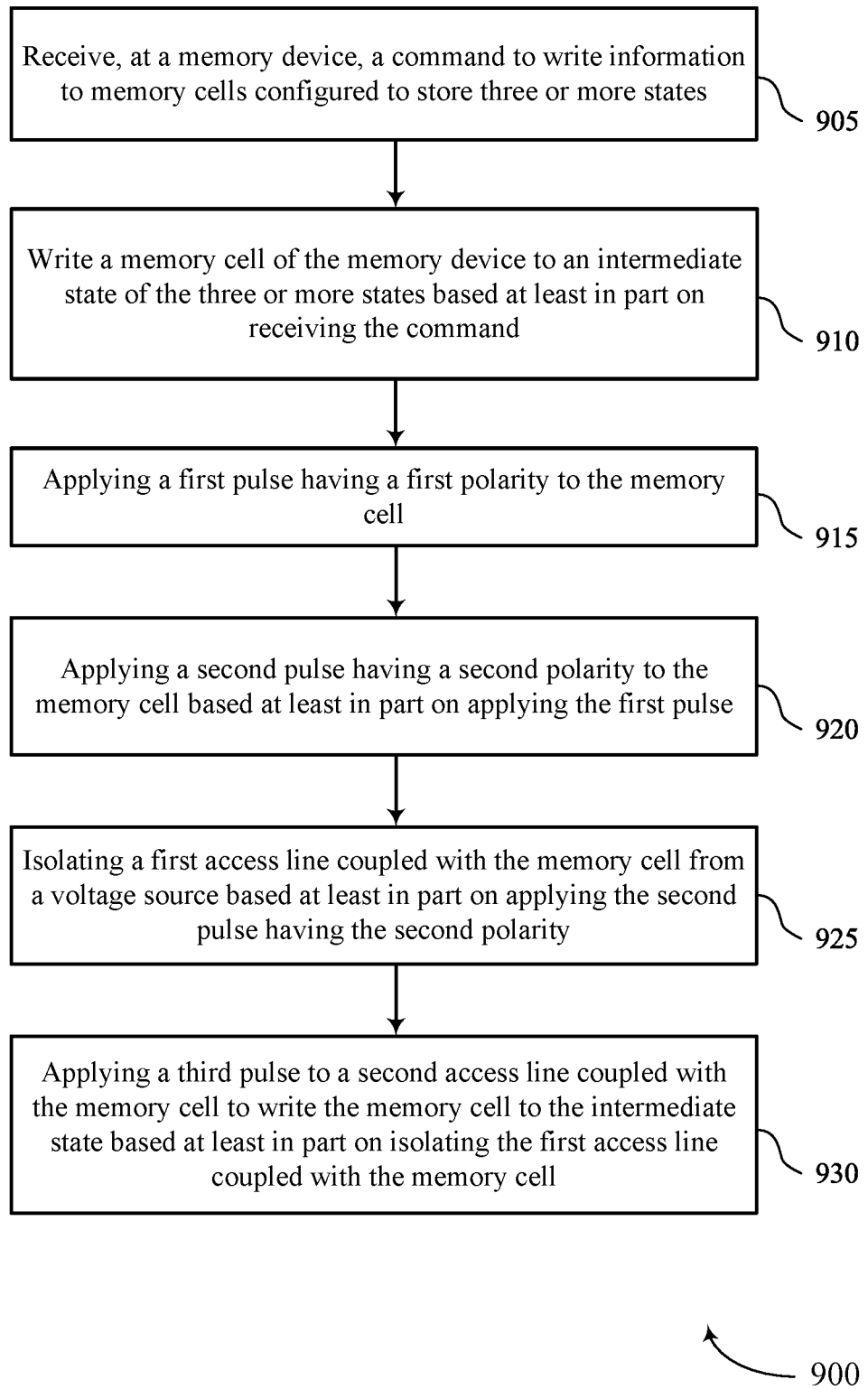

FIG. 9 shows a flowchart illustrating a method 900 that supports programming techniques for polarity-based memory cells in accordance with examples as disclosed herein. The operations of method 900 may be implemented by a memory device or its components as described herein. For example, the operations of method 900 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 905, the method may include receiving, at a memory device, a command to write information to memory cells configured to store three or more states. The operations of 905 may be performed in accordance with examples as disclosed herein. In some examples, aspects of the operations of 905 may be performed by a receiving component 725 as described with reference to FIG. 7.

At 910, the method may include writing a memory cell of the memory device to an intermediate state of the three or more states based at least in part on receiving the command, where writing the memory cell to the intermediate state may include the features described with reference to 915, 920, 925, and 930. The operations of 910 may be performed in accordance with examples as disclosed herein. In some examples, aspects of the operations of 910 may be performed by an access operation component 730 as described with reference to FIG. 7.

At 915, the method may include applying a first pulse having a first polarity to the memory cell. The operations of 915 may be performed in accordance with examples as disclosed herein. In some examples, aspects of the operations of 915 may be performed by an access operation component 730 as described with reference to FIG. 7.

At 920, the method may include applying a second pulse having a second polarity to the memory cell based at least in part on applying the first pulse. The operations of 920 may be performed in accordance with examples as disclosed herein. In some examples, aspects of the operations of 920 may be performed by an access operation component 730 as described with reference to FIG. 7.

At 925, the method may include isolating a first access line coupled with the memory cell from a voltage source based at least in part on applying the second pulse having the second polarity. The operations of 925 may be performed in accordance with examples as disclosed herein. In some examples, aspects of the operations of 925 may be performed by an isolation component 735 as described with reference to FIG. 7.

At 930, the method may include applying a third pulse to a second access line coupled with the memory cell to write the memory cell to the intermediate state based at least in part on isolating the first access line coupled with the memory cell. The operations of 930 may be performed in accordance with examples as disclosed herein. In some examples, aspects of the operations of 930 may be performed by an access operation component 730 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor) for receiving, at a memory device, a command to write information to memory cells configured to store three or more states, writing a memory cell of the memory device to an intermediate state of the three or more states based at least in part on receiving the command, where writing the memory cell to the intermediate state includes, applying a first pulse having a first polarity to the memory cell, applying a second pulse having a second polarity to the memory cell based at least in part on applying the first pulse, isolating a first access line coupled with the memory cell from a voltage source based at least in part on applying the second pulse having the second polarity, and applying a third pulse to a second access line coupled with the memory cell to write the memory cell to the intermediate state based at least in part on isolating the first access line coupled with the memory cell.

In some cases of the method 900 and the apparatus described herein, writing the memory cell to the intermediate state may include operations, features, circuitry, logic, means, or instructions for biasing the first access line to a first voltage based at least in part on applying the second pulse, where isolating the first access line may be based at least in part on biasing the first access line to the first voltage.

In some instances of the method 900 and the apparatus described herein, the first pulse may be applied to the memory cell for a first duration and the third pulse may be applied for a second duration, the first duration greater than the second duration.

In some examples of the method 900 and the apparatus described herein, isolating the first access line may include operations, features, circuitry, logic, means, or instructions for biasing a gate of a transistor coupled with the voltage source and the first access line to a first voltage, where the transistor may be deactivated based at least in part on biasing the gate of the transistor.

In some instances of the method 900 and the apparatus described herein, isolating the first access line may include operations, features, circuitry, logic, means, or instructions for deactivating the voltage source based at least in part on an absence of receiving a signal.

In some examples of the method 900 and the apparatus described herein, applying the first pulse to the memory cell that may have the first polarity may include operations, features, circuitry, logic, means, or instructions for biasing the first access line to a first voltage and biasing the second access line to a second voltage.

In some cases of the method 900 and the apparatus described herein, applying the second pulse to the memory cell that may have the second polarity may include operations, features, circuitry, logic, means, or instructions for biasing the first access line to the second voltage and biasing the second access line to the first voltage.

In some examples of the method 900 and the apparatus described herein, the first access line includes a word line and the second access line includes a digit line.

In some instances of the method 900 and the apparatus described herein, the first access line includes a digit line and the second access line includes a word line.

It should be noted that the methods described herein describe possible implementations, and that the operations and the steps may be rearranged or otherwise modified and that other implementations are possible. Furthermore, portions from two or more of the methods may be combined.

Another apparatus is described. The apparatus may include a memory array including memory cells, the memory cells including a chalcogenide material and configured to store a set state, a reset state, and an intermediate state, a controller coupled with the memory array and configured to cause the apparatus to receive a command to write information to the memory cells and write a memory cell of the memory cells to the intermediate state based at least in part on receiving the command, where to write the memory cell to the intermediate state the controller is further configured to, apply a first pulse having a first polarity to the memory cell, the first pulse configured to condition the memory cell, isolate a first access line coupled with the memory cell from a voltage source based at least in part on applying the first pulse having the first polarity, and apply a second pulse to a second access line coupled with the memory cell based at least in part on isolating the first access line coupled with the memory cell.

In some instances, the apparatus may include bias the first access line to a first voltage, where the controller may be configured to isolate the first access line based at least in part on biasing the first access line to the first voltage.

Another apparatus is described. The apparatus may include a memory array including memory cells, the memory cells configured to store three or more states, a controller coupled with the memory array and configured to cause the apparatus to receive a write command to write information to the memory cells and write a memory cell of the memory cells to an intermediate state of the three or more states based at least in part on receiving the command, where to write the memory cells to the intermediate state the controller is further configured to, apply a first pulse having a first polarity to the memory cell, apply a second pulse having a second polarity to the memory cell based at least in part on applying the first pulse, isolate a first access line coupled with the memory cell from a voltage source based at least in part on applying the second pulse having the second polarity, and apply a third pulse to a second access line coupled with the memory cell based at least in part on isolating the first access line coupled with the memory cell.

In some cases, the apparatus may include bias the first access line to a first voltage based at least in part on applying the second pulse, where the controller may be configured to isolate the first access line based at least in part on biasing the first access line to the first voltage.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving, at a memory device, a command to write information to memory cells comprising a chalcogenide material and configured to store a set state, a reset state, and an intermediate state; and
writing a memory cell of the memory device to the intermediate state based at least in part on receiving the command, wherein writing the memory cell to the intermediate state comprises:
applying a first pulse having a first polarity to the memory cell, the first pulse configured to condition the memory cell;
isolating a first access line coupled with the memory cell from a voltage source based at least in part on applying the first pulse having the first polarity; and
applying a second pulse to a second access line coupled with the memory cell based at least in part on isolating the first access line coupled with the memory cell.

2. The method of claim 1, wherein writing the memory cell to the intermediate state further comprises:
biasing the first access line to a first voltage, wherein isolating the first access line is based at least in part on biasing the first access line to the first voltage.

3. The method of claim 1, wherein the first pulse is applied to the memory cell for a first duration, the second pulse is applied for a second duration, the first duration greater than the second duration.

4. The method of claim 1, wherein writing the memory cell to the intermediate state further comprises:
applying, before isolating the first access line, a third pulse having a second polarity to the memory cell, the third pulse configured to condition the memory cell.

5. The method of claim 4, wherein the first polarity is a positive polarity and the second polarity is a negative polarity.

6. The method of claim 4, wherein the first pulse is configured to mitigate drift of a threshold voltage associated with the memory cell.

7. The method of claim 1, wherein isolating the first access line from the voltage source further comprises:
biasing a gate of a transistor coupled with the voltage source and the first access line to a first voltage, wherein the transistor is deactivated based at least in part on biasing the gate of the transistor.

8. The method of claim 1, wherein isolating the first access line from the voltage source further comprises:
deactivating the voltage source based at least in part on an absence of receiving a signal.

9. The method of claim 1, wherein applying the second pulse to the second access line further comprises:
biasing the second access line to a first voltage.

10. The method of claim 1, wherein applying the first pulse to the memory cell that has the first polarity further comprises:
biasing the first access line to a first voltage; and
biasing the second access line to a second voltage.

11. The method of claim 1, wherein the first access line comprises a word line and the second access line comprises a digit line.

12. The method of claim 1, wherein the first access line comprises a digit line and the second access line comprises a word line.

13. A method, comprising:
receiving, at a memory device, a command to write information to memory cells configured to store three or more states; and
writing a memory cell of the memory device to an intermediate state of the three or more states based at least in part on receiving the command, wherein writing the memory cell to the intermediate state comprises:
applying a first pulse having a first polarity to the memory cell;
applying a second pulse having a second polarity to the memory cell based at least in part on applying the first pulse;
isolating a first access line coupled with the memory cell from a voltage source based at least in part on applying the second pulse having the second polarity; and
applying a third pulse to a second access line coupled with the memory cell to write the memory cell to the intermediate state based at least in part on isolating the first access line coupled with the memory cell.

14. The method of claim 13, wherein writing the memory cell to the intermediate state further comprises:
biasing the first access line to a first voltage based at least in part on applying the second pulse, wherein isolating the first access line is based at least in part on biasing the first access line to the first voltage.

15. The method of claim 13, wherein the first pulse is applied to the memory cell for a first duration and the third pulse is applied for a second duration, the first duration greater than the second duration.

16. The method of claim 13, wherein isolating the first access line further comprises:
biasing a gate of a transistor coupled with the voltage source and the first access line to a first voltage, wherein the transistor is deactivated based at least in part on biasing the gate of the transistor.

17. The method of claim 13, wherein isolating the first access line further comprises:
deactivating the voltage source based at least in part on an absence of receiving a signal.

18. The method of claim 13, wherein applying the first pulse to the memory cell that has the first polarity further comprises:
biasing the first access line to a first voltage; and
biasing the second access line to a second voltage.

19. The method of claim 18, wherein applying the second pulse to the memory cell that has the second polarity further comprises:
biasing the first access line to the second voltage; and
biasing the second access line to the first voltage.

20. The method of claim 13, wherein the first access line comprises a word line and the second access line comprises a digit line.

21. The method of claim 13, wherein the first access line comprises a digit line and the second access line comprises a word line.

22. An apparatus, comprising:
a memory array comprising memory cells, the memory cells comprising a chalcogenide material and configured to store a set state, a reset state, and an intermediate state; and a controller coupled with the memory array and configured to cause the apparatus to:
  receive a command to write information to the memory cells; and
  write a memory cell of the memory cells to the intermediate state based at least in part on receiving the command, wherein to write the memory cell to the intermediate state the controller is further configured to:
    apply a first pulse having a first polarity to the memory cell, the first pulse configured to condition the memory cell;
    isolate a first access line coupled with the memory cell from a voltage source based at least in part on applying the first pulse having the first polarity; and
    apply a second pulse to a second access line coupled with the memory cell based at least in part on isolating the first access line coupled with the memory cell.

23. The apparatus of claim 22, wherein the controller is further configured to cause the apparatus to:
  bias the first access line to a first voltage, wherein the controller is configured to isolate the first access line based at least in part on biasing the first access line to the first voltage.

24. An apparatus, comprising:
a memory array comprising memory cells, the memory cells configured to store three or more states; and
a controller coupled with the memory array and configured to cause the apparatus to:
  receive a command to write information to the memory cells; and
  write a memory cell of the memory cells to an intermediate state of the three or more states based at least in part on receiving the command, wherein to write the memory cells to the intermediate state the controller is further configured to:
    apply a first pulse having a first polarity to the memory cell;
    apply a second pulse having a second polarity to the memory cell based at least in part on applying the first pulse;
    isolate a first access line coupled with the memory cell from a voltage source based at least in part on applying the second pulse having the second polarity; and
    apply a third pulse to a second access line coupled with the memory cell based at least in part on isolating the first access line coupled with the memory cell.

25. The apparatus of claim 24, wherein the controller is further configured to:
  bias the first access line to a first voltage based at least in part on applying the second pulse, wherein the controller is configured to isolate the first access line based at least in part on biasing the first access line to the first voltage.

\* \* \* \* \*